United States Patent
Jeffet et al.

(10) Patent No.: US 11,520,661 B1
(45) Date of Patent: Dec. 6, 2022

(54) SCHEDULING OF DATA REFRESH IN A MEMORY BASED ON DECODING LATENCIES

(71) Applicant: Apple Inc., Cupertino, CA (US)

(72) Inventors: Michael Jeffet, Tel Aviv (IL); Itay Sagron, Gedera (IL); Nir Tishbi, Kfar Saba (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/372,568

(22) Filed: Jul. 12, 2021

(51) Int. Cl.
   *G06F 11/10* (2006.01)
   *G06F 3/06* (2006.01)

(52) U.S. Cl.
   CPC .......... *G06F 11/1076* (2013.01); *G06F 3/064* (2013.01); *G06F 3/0619* (2013.01); *G06F 3/0659* (2013.01); *G06F 3/0673* (2013.01)

(58) Field of Classification Search
   CPC .... G06F 11/1076; G06F 3/0619; G06F 3/064; G06F 3/0659; G06F 3/0673; G06F 3/0679; H03M 13/3707
   See application file for complete search history.

(56) References Cited

U.S. PATENT DOCUMENTS

| | | | |
|---|---|---|---|
| 9,069,719 B2 | 6/2015 | Ong | |
| 9,653,141 B2 | 5/2017 | Kim et al. | |
| 10,353,598 B2 | 7/2019 | Huang et al. | |
| 10,529,434 B2 | 1/2020 | Miller et al. | |
| 10,839,886 B2 | 11/2020 | Yuan et al. | |
| 10,861,519 B2 | 12/2020 | Jones et al. | |
| 2011/0066765 A1* | 3/2011 | Mochizuki | G06F 11/1441 710/14 |
| 2013/0007357 A1* | 1/2013 | Isaac | G11C 11/40618 711/E12.001 |
| 2017/0110207 A1* | 4/2017 | Jung | G06F 3/0611 |
| 2018/0218767 A1 | 8/2018 | Wolff | |
| 2020/0211664 A1 | 7/2020 | Vashi et al. | |
| 2020/0258578 A1 | 8/2020 | Muchherla et al. | |
| 2020/0373943 A1* | 11/2020 | Cho | G06F 3/0679 |

* cited by examiner

*Primary Examiner* — Shelly A Chase
(74) *Attorney, Agent, or Firm* — Kligler & Associates Patent Attorneys Ltd

(57) ABSTRACT

An apparatus includes a memory and one or more processors. The memory includes multiple memory blocks. The one or more processors are configured to read at least part of data stored in a group of one or more memory blocks, the data including multiple code words of an Error Correction Code (ECC) that is decodable using one or more processing elements selected from among multiple predefined processing elements. The one or more processor are further configured to decode one or more of the code words, and identify one or more of the predefined processing elements that actually participated in decoding the respective code words, and, based on cost-values associated with the identified processing elements, the cost-values are indicative of processing latencies respectively incurred by the identified processing elements, to make a decision of whether or not to refresh the one or more memory blocks in the group.

20 Claims, 3 Drawing Sheets

SCHEDULING OF DATA REFRESH IN A MEMORY BASED ON DECODING LATENCIES

TECHNICAL FIELD

Embodiments described herein relate generally to data storage, and particularly to methods and systems for scheduling of data refresh in a memory.

BACKGROUND

Reliability of data stored in a nonvolatile memory typically degrades over time. To improve performance and prevent data loss, data that is stored for a long period of time should be refreshed.

Methods for refreshing data stored in a memory are known in the art. For example, U.S. Pat. No. 10,353,598 describes systems, apparatuses, and methods that refresh data in a memory. Data is programmed into the memory. After which, part or all of the data may be refreshed. The refresh of the data may be different from the initial programming of the data in one or more respects. For example, the refresh of the data may include fewer steps than the programming of the data and may be performed without erasing a section of memory. Further, the refresh of the data mat be triggered in one of several ways. For example, after programming the data, the data may be analyzed for errors. Based on the number of errors found, the data may be refreshed.

As another example, U.S. Patent Application Publication 2020/0211664 describes a variety of applications can include systems and/or methods of optimizing results from scanning a memory device, where the memory device has stacked multiple reliability specifications. Information about a block of multiple blocks of a memory device can be logged, where the information is associated with a combination of reliability specifications. A refresh of the block can be triggered based on exceeding a threshold condition for the combination of reliability specifications. Additional apparatus, systems, and methods are disclosed.

SUMMARY

An embodiment that is described herein provides an apparatus that includes a memory and one or more processors. The memory includes multiple memory blocks. The one or more processors are configured to read at least part of data stored in a group of one or more memory blocks, the data including multiple code words of an Error Correction Code (ECC), and the ECC is decodable using one or more processing elements selected from among multiple predefined processing elements. The one or more processors are further configured to decode one or more of the code words, and identify one or more of the predefined processing elements that actually participated in decoding the respective code words, and, based on cost-values associated with the identified processing elements, the cost-values are indicative of processing latencies respectively incurred by the identified processing elements, to make a decision of whether or not to refresh the one or more memory blocks in the group.

In some embodiments, the predefined processing elements perform respective operations required for decoding of the ECC, and are associated with respective processing latencies. In other embodiments, the group includes multiple memory blocks, and the one or more processors are configured to program data encoded using the ECC to the memory blocks in the group in parallel, and to read stored data from the memory blocks in the group, in parallel. In yet other embodiments, the one or more processors are configured to calculate a weighted sum of the cost-values, and to make the decision by comparing the weighted sum to a predefined decision threshold.

In an embodiment, the one or more processors are configured to estimate, based on the cost-values, a readout throughput of the data from the one or more memory blocks in the group, and to make the decision by comparing the estimated readout throughput to a predefined threshold throughput. In another embodiment, the one or more processors are configured to select the group, by identifying that a retention period of at least one of the memory blocks in the group exceeded a predefined retention-time threshold. In yet another embodiment, the group includes multiple memory blocks belonging to multiple dies, and the one or more processors are configured to make the decision jointly for the multiple memory blocks in the respective dies.

In some embodiments, the one or more processors are configured to hold first cost-values for the multiple dies and second different cost-values for a single die, to evaluate an all-dies cost-value using the first cost-value, to evaluate multiple single-die cost-values using the second cost-values, and to make the decision based on both the all-dies cost-value and on the multiple single-die cost-values. In other embodiments, the one or more processors are configured to associate first cost-values with respective processing elements in a first configuration of the apparatus, and to associate second different cost-values with same processing elements in a second different configuration of the apparatus. In yet other embodiments, the one or more processors are configured to specify scanning multiple code words for making the decision, and to stop scanning the specified code words upon detecting, based on a partial subset of the specified code words, that a predefined target readout throughput is unachievable.

There is additionally provided, in accordance with an embodiment that is described herein, a method, including, in a memory that includes multiple memory blocks, reading at least part of data stored in a group of one or more memory blocks, the data includes multiple code words of an Error Correction Code (ECC), and the ECC is decodable using one or more processing elements selected from among multiple predefined processing elements. One or more of the code words are decoded, and one or more of the predefined processing elements that actually participated in decoding the respective code words are identified. Based on cost-values associated with the identified processing elements, the cost-values are indicative of processing latencies respectively incurred by the identified processing elements, a decision is made of whether or not to refresh the one or more memory blocks in the group.

These and other embodiment will be more fully understood from the following detailed description of the embodiments thereof, taken together with the drawings in which:

DETAILED DESCRIPTION OF EMBODIMENTS

Overview

Figure 1:
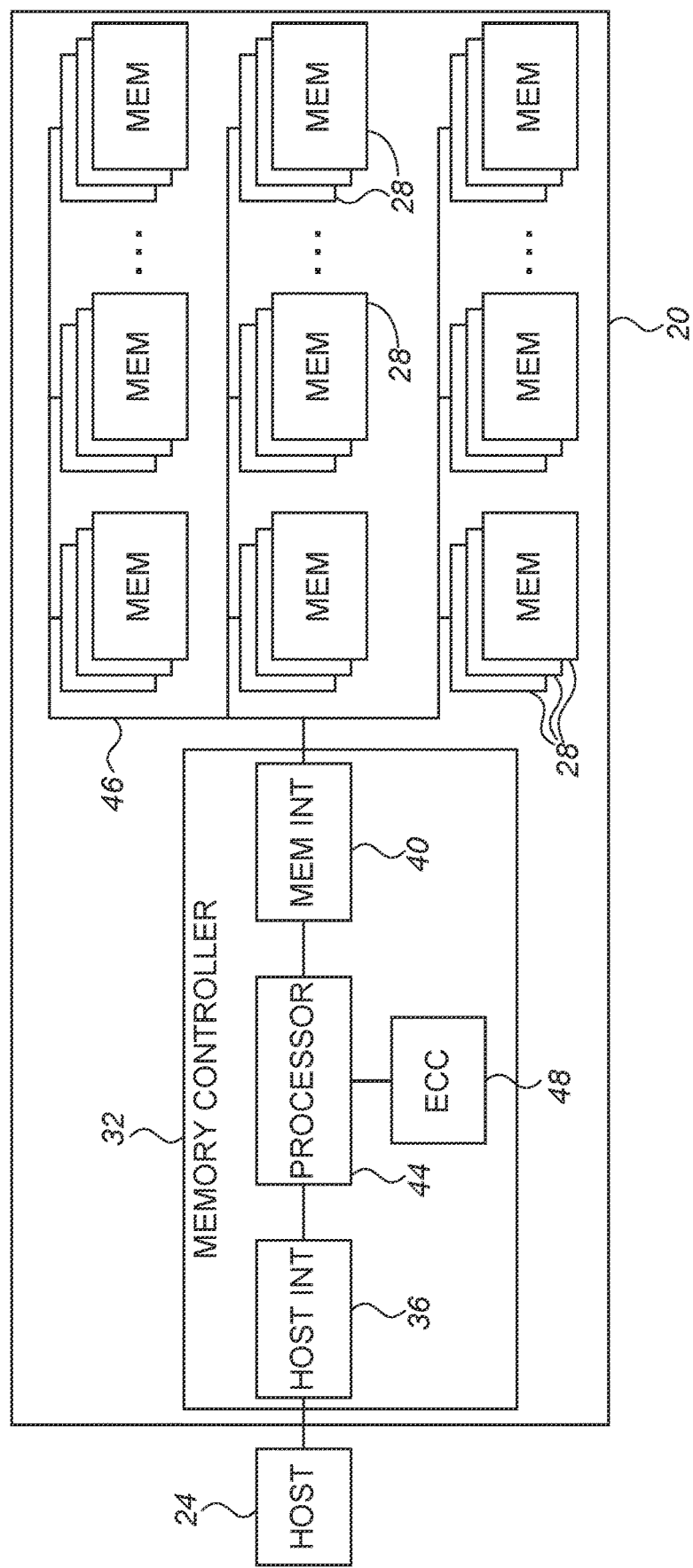
FIG. 1 is a block diagram that schematically illustrates a multi-device memory system, in accordance with an embodiment that is described herein.

Embodiments that are described herein provide improved methods and systems for scheduling of data refresh in a memory based on predefined latencies assigned to processing elements participating in decoding of retrieved data.

In various types of nonvolatile memory devices, data retrieved from the memory may contain errors. Moreover, the number of errors in data units read from the memory tends to increase over time due to various physical stress factors, e.g., aging of the memory device, the number of erase-program cycles applied to memory blocks, the time duration that has elapsed since a memory block has been programmed and the temperature sustained during this time duration, and temperature differences between data programming and reading.

To handle readout errors, data is typically stored in the memory encoded using a suitable Error Correction Code (ECC). An encoded data unit is also referred to as a code word of the ECC. Upon reading a code word from memory, the cone word is decoded in accordance with the ECC, using a suitable decoding scheme. Over time, as the number of errors increases, stronger decoding techniques may be required for successful decoding, which in turn increases decoding latency and therefore degrades the readout throughput.

One approach to retain high readout throughput over time is to occasionally refresh the stored data. In general, to avoid significant degradation in the readout throughput, the refresh rate should be sufficiently high. A high refresh rate, however, undesirably increases the number of erase-programming operations and consumes processing cycles and power. Increasing the number of erase-programming operations result in drawbacks, such as, (i) reducing future data reliability and readout throughput, and (ii) increasing the failure-rate of the storage system due to a higher stress.

In principle, data refresh could be scheduled based on translating the impact of various stress factors into a bit error rate estimation and/or into readout throughput estimation. Such translation, however, is typically nontrivial or even impossible, as described herein.

For example, the maximal number of erase-programming cycles (also referred to as "endurance") may vary among memory cells within and across memory devices, e.g., due to fabrication tolerances and mass-production variations, Therefore, translating the number of erase-programing cycles into readout throughput may be inconsistent over different parts of the memory.

As another example, the impact of the time elapsed since last programming (also referred to as "retention") on the bit error rate, is highly dependent on the temperature of the memory device during the retention period. Since temperature measurements are not always available, it is typically infeasible to translate the retention period into a bit error rate. As yet another example, the bit error rate typically depends on the temperature difference between programming and reading (also referred to as a "cross-temperature" effect). The impact of the cross-temperature effect may, however, vary among different memory cells within a memory block, and is therefore hard to translate consistently into a bit error rate.

The required data refresh rate typically depends on the workload associated with the user of the memory system, so that the refresh rate required for light-workload users may be lower than that of heavy-workload users. Moreover, the workload of a given user may vary over time. For example, in general purpose computing platforms, users may run any kind of workloads, from basic usage, up to power-intensive usage such as, for example, 24/7 data analysis and 3D rendering. Consequently, the data refresh rate should be adapted to the actual instantaneous workload.

Since stress factors are hard to translate into bit error rate or readout throughput, as described above, data refresh scheduling is conventionally based on assuming worst-case conditions related to user workload and to the impact of endurance, retention, and cross-temperature on the bit error rate. The conventional approach, however, aims to prevent performance degradation for the top percentile of the users (in terms of their usage profiles) and to extreme operational and environmental conditions, as well as to worst-case device behavior. Consequently, the conventional approach often results in unnecessarily frequent data refresh operations, which increase device wear-out and defect formation.

In the disclosed embodiments, close to optimal schedule of data refresh is determined for localized data, so that refresh of a given data unit is closely related to the readout throughput performance of the memory device. Moreover, the disclosed techniques require no explicit metering of any physical conditions or attributes and do not rely on possessing any knowledge on the relationship between such physical conditions and bit error rate.

In the disclosed techniques, groups of memory blocks that are candidate for refresh are repeatedly scanned. A scanning cycle may be triggered, for example, based on the time elapsed since a memory block has been written. Scanning may be deferred, for example, to a time when the device is idle and has sufficient energy to perform the scanning. During the scanning of a group of memory blocks, the readout throughput from the memory blocks is estimated. A decision to refresh the memory blocks in the group is made based on the estimated readout throughput. For example, decide to perform data refresh when the estimated readout throughput degrades below a predefined target throughput.

To estimate the readout throughput, processing elements that may be used in decoding the scanned code words are assigned respective latencies. In decoding a cone word, the latencies of the actual processing elements that participated in the decoding process are logged and used in estimating the readout throughput. As the bit error rate increases, stronger decoding techniques of higher complexity, power consumption and latency may be required, resulting in a longer decoding latency and reduced value of the estimated readout throughput.

Consider an embodiment of an apparatus that includes a memory and one or more processors. The memory includes multiple memory blocks. The one or more processors are configured to read at least part of data stored in a group of one or more memory blocks, the data includes multiple code words of an Error Correction Code (ECC) wherein the ECC is decodable using one or more processing elements selected from among multiple predefined processing elements. The one or more processors are further configured to decode one or more of the code words, and identify one or more of the predefined processing elements that actually participated in decoding the respective code words. Based on cost-values associated with the identified processing elements, wherein the cost-values are indicative of processing latencies respectively incurred by the identified processing elements, the one or more processors are configured to make a decision of whether or not to refresh the one or more memory blocks in the group.

In some embodiments, the predefined processing elements perform respective operations required for decoding of the ECC, and are associated with respective processing latencies. In some embodiments, the scanned group includes multiple memory blocks, and the one or more processors are configured to program data encoded using the ECC to the memory blocks in the group in parallel, and to read stored data from the memory blocks in the group, in parallel.

The one or more processors may make the decision in various ways. In one embodiment, the one or more processors calculate a weighted sum of the cost-values, and make the decision by comparing the weighted sum to a predefined decision threshold. In another embodiment, the one or more processors estimate, based on the cost-values, a readout throughput of the data from the one or more memory blocks in the group, and make the decision by comparing the estimated readout throughput to a predefined threshold throughput.

The one or more processors may select the group, for example, by identifying that a retention period of at least one of the memory blocks in the group exceeded a predefined retention-time threshold.

In some embodiments, the group includes multiple memory blocks belonging to multiple dies, and the one or more processors make the decision jointly for the multiple memory blocks in the respective dies.

In a multi-die configuration of the memory system, the one or more processors may hold first cost-values for the multiple dies and second different cost-values for a single die. The one or more processors evaluate an all-dies cost-value using the first cost-value, evaluate multiple sing-die cost-values using the second cost-values, and make the decision based on both the all-dies cost-value and on the multiple single-die cost-values.

In an embodiment, the one or more processors associate first cost-values with respective processing elements in a first configuration of the apparatus, and associate second different cost-values with same processing elements in a second different configuration of the apparatus.

In some embodiments, the one or more processors are configured to specify scanning multiple code words for making the decision, and to stop scanning the specified code words upon detecting, based on a partial subset of the specified code words, that a predefined target readout throughput is unachievable.

In the disclosed techniques, scheduling the refresh of data in memory is based on estimating latencies incurred in decoding code words retrieved from the memory device. Decoding latency is estimated by pre-assigning latency costs to processing elements that may participate in the decoding, and by logging the latencies of processing elements that actually participated in the decoding. In some disclosed embodiments, the logged latencies serve in estimating readout throughput. Using the disclosed techniques, the rate of data refresh is adapted to actual readout throughput, thus avoiding frequent unnecessary refresh operations.

System Description

FIG. 1 is a block diagram that schematically illustrates a multi-device memory system 20, in accordance with an embodiment that is described herein. Memory system 20 accepts data for storage from a host 24 and stores it in memory, and retrieves data from memory and provides it to the host. In the present example, memory system 20 includes a Solid-State Disk (SSD) that stores data for a host computer. In alternative embodiments, however, memory system 20 may be used in any other suitable application and with any other suitable host, such as in computing devices, cellular phones or other communication terminals, removable memory modules, Secure Digital (SD) cards, Multi-Media Cards (MMC) and embedded MMC (eMMC), digital cameras, music and other media players and/or any other system or device in which data is stored and retrieved.

Memory system 20 includes multiple memory devices 28, each of which including multiple memory ceils. In the present example, memory devices 28 include non-volatile NAND Flash devices, although any other suitable memory type, such as NOR and Charge Trap Flash (CTF) Flash cells, phase change RAM (PRAM, also referred to as Phase Change Memory—PCM), Nitride Read Only Memory (NROM), Ferroelectric RAM (FRAM), magnet RAM (MRAM) and/or Dynamic RAM (DRAM) cells, can also be used. In general, the disclosed embodiments are applicable to any type of a nonvolatile memory.

In some embodiments, the memory cells of devices 28 include analog memory cell that hold a continuous, analog value of a physical parameter, such as an electrical voltage or charge. Any suitable type of analog memory cells, such as the types listed above, can be used. In the present example, each memory device 28 includes a non-volatile memory of NAND Flash cells. The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

Memory system 20 stores data in the memory cells by programming the memory cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell. Similarly, a 1 bit/cell device, a 3 bit/cell device and a 4 bit/cell device are also referred to respectively as a Single-Level Cell (SLC) device, a Tri-Level Cell (TLC) device and a Quad-Level Cell (QLC) device, can be programmed to assume one of two, eight and sixteen possible programming levels, respectively.

The memory cells are typically arranged in rows and columns. Typically, a given memory device include s multiple erasure blocks (also referred to as memory blocks), i.e., groups of memory cells that are erased together. Data typically cannot be reprogrammed in-place, and memory blocks are therefore erased before being programmed with other data. Data is typically programmed to groups of memory cells, and retrieved from the groups the memory cells in data units that are referred to as data pages, or simply pages, for brevity.

Each memory device 28 may include a packaged device or an unpackaged semiconductor chip or die. A typical SSD may include a number of 64 GB devices. Generally, however, memory system 20 may include any suitable number of memory devices of any desired type and size. Although the memory system configuration of FIG. 1 includes multiple memory devices, some of the methods and systems described herein can also be used in memory systems having only a single memory device.

Memory system 20 includes a memory controller 32, which accepts data from host 24 and stores it in memory devices 28, and retrieves data from the memory devices and provides it to the host. Memory controller 32 includes a host interface 36 for communicating with host 24, a memory interface 40 for communicating with memory devices 28, and a processor 44 that processes the stored and retrieved data. In some embodiments, memory controller 32 encodes the stored data with an Error Correction Code (ECC). In these embodiments, memory controller 32 includes an ECC module 48, which encodes the data before stored in memory devices 28 and decodes the ECC of data retrieved from memory devices 28. The encoded data unit is also referred to as a "code word" (CW) of the ECC. The functions of processor 44 can be implemented, for example, using software running on a suitable Central Processing Unit (CPU), using hardware (e.g., state machine or other logic), or using a combination of software and hardware elements.

Memory controller 32 communicates with memory devices 28 over a bus 46. Bus 46 may include any suitable link or bus such as a parallel bus or a serial bus, or a packet-based bus such as a Peripheral Component Interconnect Express (PCIe) bus. Bus 46 may operate in accordance with any suitable standard or protocol, and at any suitable rate.

In the example of FIG. 1, bus 46 includes three channels, each of which connects to a different group of memory devices 28. In some embodiments, the memory controller may access multiple memory devices belonging to multiple different channels, in parallel. In some embodiments, the memory cells in memory device 28 are divided among multiple arrays of the memory cells (not shown). An array of this sort is also referred to herein as a "plane." The memory controller may access each of the planes of a memory device 28 separately, or access multiple planes of the same memory device in parallel.

To apply a storage command to a given memory device, the memory controller sends the storage command to the memory device over bus 46. Types of storage commands include, for example, page write, page read and block erasure commands. The memory device executes the storage command internally, and sends back to the controller data and/or status information as specified by the command. The memory device typically indicates to the memory controller when the memory device is ready to accept subsequent commands. In some embodiments, memory system 20 supports storage commands that are applied to multiple memory devices in parallel.

Memory controller 32, and in particular processor 44, may be implemented in hardware. Alternatively, the memory controller may include a microprocessor that runs suitable software, or a combination of hardware and software elements. In some embodiments, processor 44 includes a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

The system configuration of FIG. 1 is an example configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the example system configuration shown in FIG. 1 memory devices 28 and memory controller 32 are implemented as separate Integrated Circuits (ICs). In alternative embodiments, however, the memory devices and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which one or more of the memory devices are disposed. Further alternatively, some or all of the functionality of memory controller 32 can be implemented in software and carried out by a processor or other element of the host system, or by any other type of memory controller. In some embodiments, host 24 and Memory controller 32 may be fabricated on the same die, or on separate dies in the same device package.

Managing the Data Refresh in Memory

Figure 2:
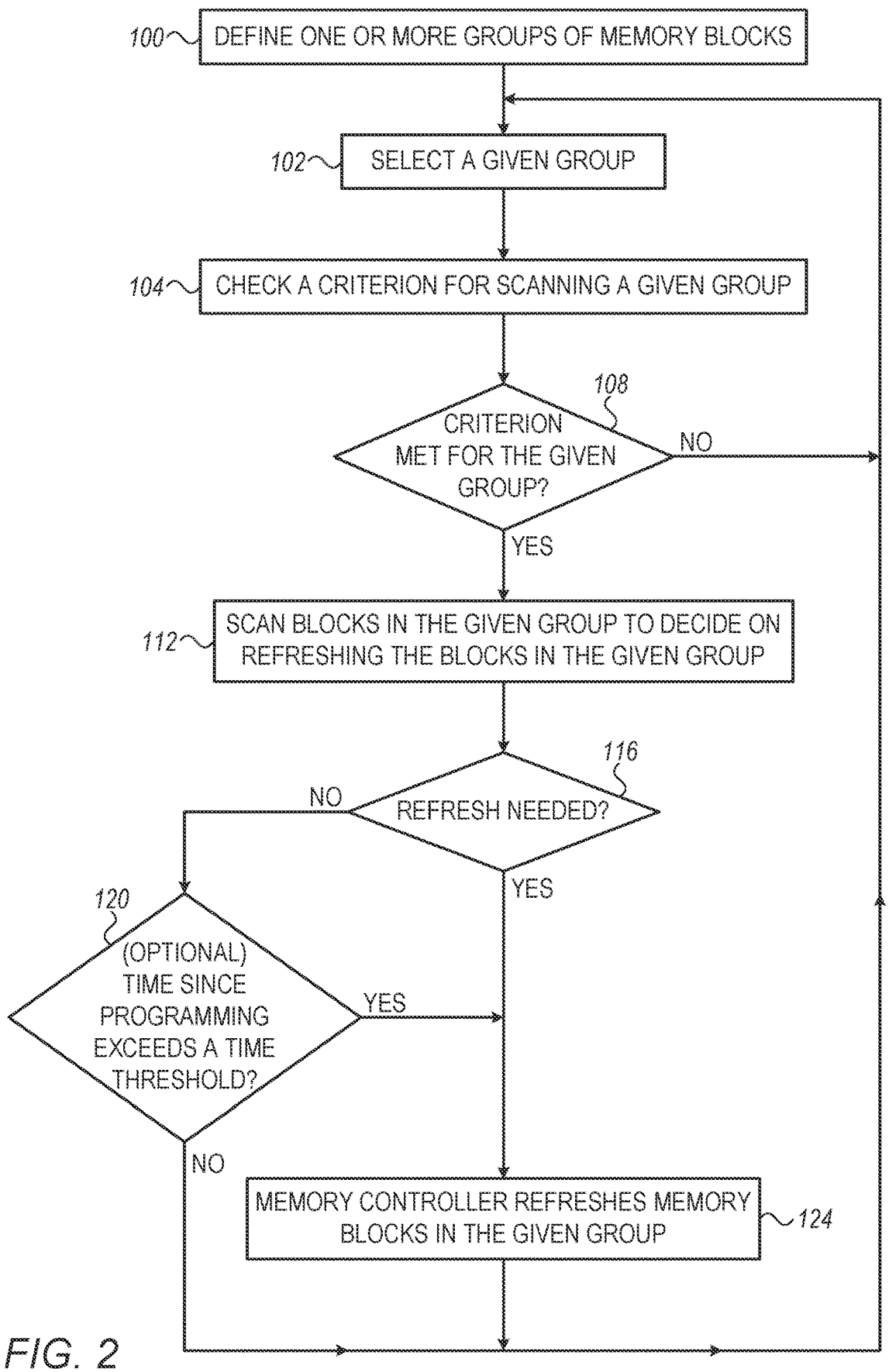
FIG. 2 is a flow chart that schematically illustrates a method for managing the refresh of data in memory, in accordance with an embodiment that is described herein.

FIG. 2 is a flow chart that schematically illustrates a method for managing the refresh of data in memory, in accordance with an embodiment that is described herein.

The method may be executed by host 24, memory controller 32 or both, of memory system 20 in FIG. 1 above. In the present example, the method will be described as executed by both host 24 and memory controller 32 (e.g., by processor 44 of the memory controller).

The method begins with host 24 defining one or more groups of memory blocks, at a group definition stage 100. Each of the defined groups may include one or more memory blocks. The memory blocks in a group are assumed to be programmed in parallel, or at least closely in time relative to the minimal interval between refresh operations. In some embodiments, the group may contain multiple memory blocks that belong to multiple respective dies, each of which includes one or more planes.

At a group selection stage 102, the host selects a given group among the groups defined at stage 100. For example, the host may select the groups in some predefined order.

At a scan criterion evaluation stage 104, the host checks a suitable criterion for scanning a given group among the groups defined at stage 100. In an example embodiment, checking the criterion includes checking whether a predefined period elapsed since the previous scanning of the given group. In other embodiments, checking the criterion includes checking whether the time that has elapsed since programming at least one of the memory blocks in the given group exceeds a predefined threshold period.

Other factors that may be considered in triggering a scan cycle include: (i) Temperature variations with or without time information related to these variations, (ii) receiving by the host, one or more messages from the memory controller for triggering a scan (e.g., due to excessive number of errors and/or operation of certain elements within the memory controller), and (iii) identifying that the previous scan cycle for this group resulted in marginal results regarding the need to perform data refresh.

At a query stage 108, the host checks whether the criterion of stage 104 has been met for the given group, and if not, loops back to stage 102 to select another group. Otherwise, the criterion has been met, and the host proceeds to a scanning stage 112. In the present example, the host carries out the scanning by sending to the memory controller commands to read the memory blocks in the given group. During a scan iteration, the memory controller may continuously read all the code word specified for this scan, or alternatively read multiple subsets of the code words, e.g., for achieving best system's energy usage, and quality of service.

As will be described in detail below, in retrieving the data from memory, the memory controller logs information required for deciding on refresh, decides whether refresh is required, and reports a corresponding refresh indication back to the host. In alternative embodiments, the host receives the logged information (or a post-processed version of the logged information) from the memory controller and makes the decision of whether data refresh is required.

In some embodiments, as will be described in detail below, the information logged by the memory controller includes predefined latencies assigned to processing elements participating in decoding EC code words read from the memory blocks in the given group. The logged latencies are indicative of the readout throughput for the given group. For accurate estimation of the readout throughput, the memory controller may assign latencies to the processing elements depending on the underlying multi-die configuration and/or on the level of parallelism in accessing the memory blocks.

It should be noted that the processing latency assigned to a given processing element may be selected so as to reflect the effective contribution of that processing element (in time units) to the degradation in readout throughput. The effective latency typically depends on the configuration of the underlying system. For example, a memory system having a multi-die configuration may suffer from collisions and congestions that may result in an effective latency that is different from the processing latency of the same processing element in a single-die configuration.

In some embodiments, the refresh indication may include one of (i) refresh is required, (ii) refresh is not required, and (iii) undetermined. In an embodiment, the memory controller reports that refreshing the memory blocks in the given group is required when all the memory blocks in the group have been scanned but the readout throughput is below a predefined target throughput.

Alternatively, the memory controller may decide that refresh is required when identifying, before concluding the entire scanning, that the target throughput cannot not be achieved. The memory controller decides that refresh is not required when all the memory blocks in the given group have been scanned, and the readout throughput is above the target throughput.

The memory controller reports that refresh is undetermined when the number of code words read during the scanning is smaller than a predefined number required for reliable estimation of the readout throughput.

At a refresh indication checking stage 116, the host checks the refresh indication provided by the memory controller, and if the indication indicates that refresh is required, the host performs a refresh operation to one or more memory blocks in the given group, at a refresh stage 124. Alternatively, the host may decide to delay the refresh operation, or to refresh only part of the memory blocks in the given group. For example, the host may delay the refresh operation until the memory system is connected to an external power source.

In the present example, the host performs the refresh operation by sending to the memory controller relevant commands. In some embodiments, for each memory block to be refreshed, the host sends to the memory controller (i) one or more read commands to retrieve the data stored in the memory block, (ii) an erase command to erase the memory block, and (iii) one or more write commands to program the retrieved data to the same or to another memory block. In an embodiment, instead of sending an erasure commend to the memory controller, the host marks the memory block, to be erased at a later occasion, e.g., shortly before the memory block is re-programmed. Following stage 124, the host loops back to stage 102 to select another group of memory blocks.

In some embodiments, when at stage 116 refresh is not required, the host proceeds to a forced refresh query stage 120, at which the host checks whether the time that has elapsed since programming at least one of the memory blocks in the given group exceeds a predefined time threshold, and if so proceeds to stage 124 to perform the refresh operation as described above. Otherwise, no refresh is needed, and the host loops back to stage 102 to select another group. stage 120 is optional and may be omitted.

In some embodiments, the conditions of whether to refresh the given group are marginal. In such embodiments, the memory controller or the host may consider some physical condition to strengthen the validity of the decision. For example, in making the refresh decision the memory controller or the host may also consider the cross-temperature effect during scanning, relative to the system's overall cross-temperature statistics.

In the method of FIG. 2, various scanning schemes may be used, e.g., to save power and/or scanning time. For example, at stage 100, the host may select for scanning only memory blocks that were programmed earlier than the maximal permissible retention period under worst-case conditions. As another example, at stage 100, the host may bin multiple memory blocks into a group based on retention time and/or other physical conditions. Moreover, the host may scan only a partial subset of the memory blocks in one or more groups and/or a partial subset of the code words in one or more memory blocks. In some embodiments the host determines the interval between successive scan operations applied to a given group (e.g., to be checked at stage 108) based on readout throughput estimated in previous scans.

In an example embodiment, the host starts scanning a group of memory blocks after D1 days since the memory blocks have been programmed, and scans these memory blocks once every D2 days. The parameters D1 and D2 typically depend on the time of life of the memory device, e.g., D1 and D2 may be set to longer durations at Start Of Life (SOL) compared to End Of Life (EOL) of the memory device.

Methods for Deciding on Data Refresh

Figure 3:
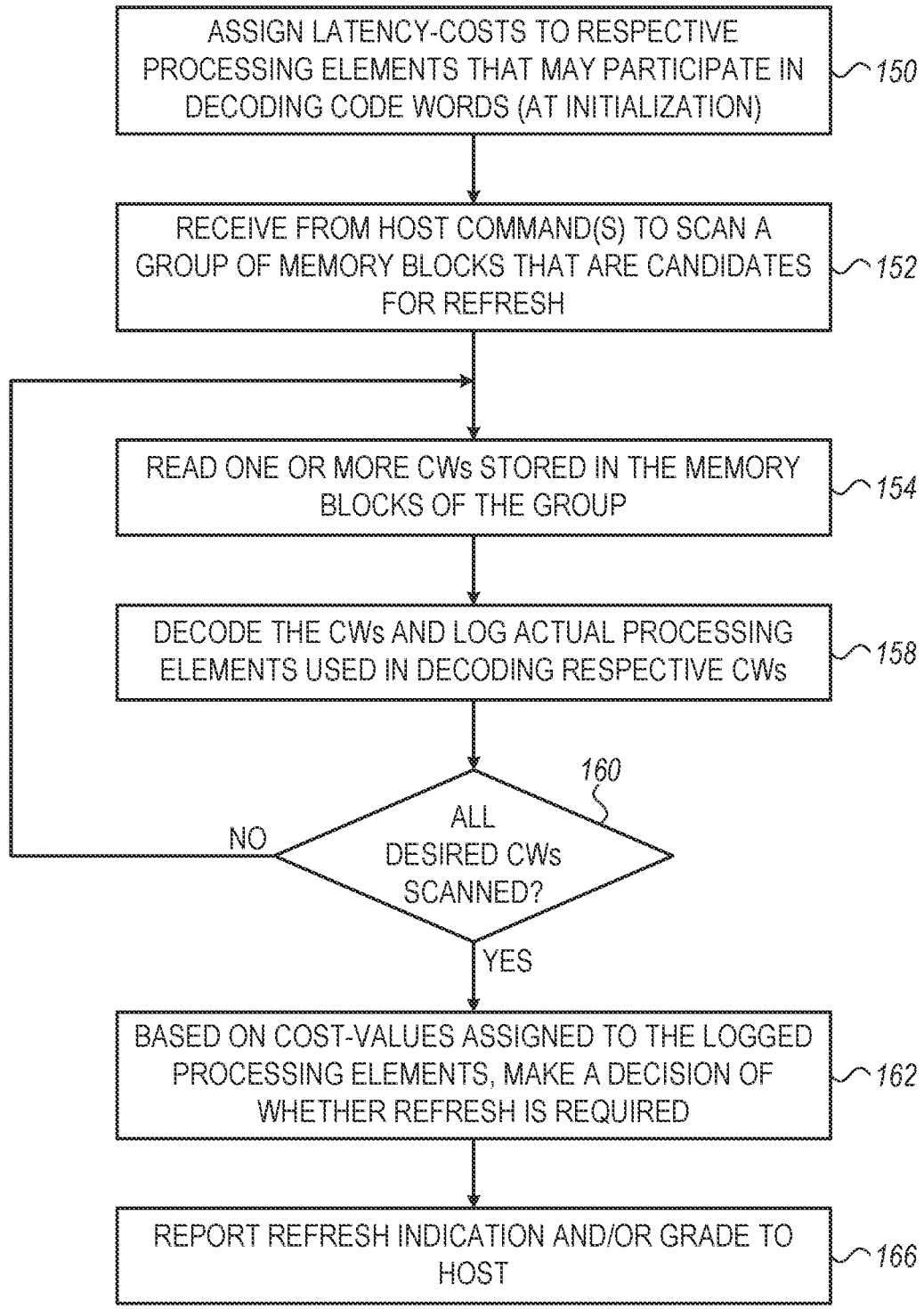
FIG. 3 is a flow chart that schematically illustrates a method for deciding on whether to refresh data in memory, in accordance with an embodiment that is described herein.

FIG. 3 is a flow chart that schematically illustrates a method for deciding on whether to refresh data in memory, in accordance with an embodiment that is described herein.

The method may be implemented as part of stage 112 of the method of FIG. 2 above. The method of FIG. 3 will be described as executed by memory controller 32 (e.g., by processor 44 of the memory controller).

The method begins with memory controller 32 assigning latency cost-values, at an assignment stage 150. The memory controller may execute stage 150 once, e.g., at initialization. In alternative embodiments, the host assigns the latency cost-values and provides them to the memory controller.

In an embodiment, the latency cost-values may be pre-determined offline and provisioned to the memory controller, e.g., at initialization. The latency cost-values are associated with respective processing elements that may participate in decoding code words retrieved from memory blocks. The processing elements may include low-complexity decoding methods such as hard decoding, and higher-complexity decoding methods such as soft decoding that may be applied when low-complexity decoding fails.

In the present context and in the claims the term "decode" is not limited only to performing ECC decoding to a code word in accordance with the underlying ECC, but also to any processing that is involved in recovering the unencoded data. Processing of this sort may include, for example, calculating soft metrics for soft decoding, adjusting read thresholds and the like. In some embodiments, the latency cost-values include effective latencies that are indicative of the contribution of the respective processing elements to the readout throughput of the memory system. The readout throughput is specified by the amount of data that the host reads from the memory devices in a time unit.

The overall decoding process typically starts by attempting to decode the retrieved code word using a processing element that implements a decoding method of low decoding capability and low complexity. Such a decoding method is fast and incurs short latency. If the low capability decoding method fails, the decoding process attempts decoding using another processing element that implements a decoding method having a higher decoding capability at a higher complexity. The process of engaging higher-capability, higher-complexity processing elements for decoding the code word may continue until the code word is successfully decoded, or when the overall decoding fails. The overall decoding process thus includes a chain of processing elements of increasing respective decoding capabilities and complexities.

At a command reception stage 152, memory controller 32 receives from host 24 one or more commands to scan memory blocks belonging to a predefined group or memory blocks. The purpose of the scan operation is to decide whether the memory blocks in the group need to be refreshed in order to retain high read-throughput performance.

At a reading stage 154, the memory controller reads one or more code words stored in the memory blocks specified in the scan command(s). In general, the code words may be retrieved from multiple different dies and planes.

At a decoding stage 158, the memory controller decodes the code words read at stage 154. In the present context, the decoding of a code word refers not only to the decoding of the ECC, but also to other operations that are required for recovering the decoded code word. It should be noted that the memory controller applies the same (or similar) decoding process during scanning for refresh and in reading data by the host, so that the accumulated latencies of the processing elements used in the decoding during scanning reflects their contribution to the true readout throughput by the host. Further at stage 158, the memory controller logs the actual processing elements that were respectively used in decoding the code words. Alternatively or additionally, the memory controller logs the cost-values respectively assigned to the identified processing elements. In some embodiments, in logging the processing elements used and/or their respective latencies, the memory controller keeps track of the dies from which the code words were respectively read. The die information allows the memory controller to evaluate a latency cost for each die separately, as will be described further below.

At a scanning loop handling stage 160, the memory controller checks whether all code words specified to be scanned have been read, and if not, loops back to stage 154 to read one or more subsequent code words. Otherwise, the memory controller proceeds to a decision-making stage 162, at which the memory controller makes a decision of whether refresh is required to the memory blocks in the group, based on cost-values respectively assigned to the logged processing elements.

In some embodiments, the memory controller makes the decision by calculating, based on the cost-values of the logged processing elements, an overall cost-value, and compares the overall cost-value to a predefined latency threshold. In other embodiments, the memory controller calculates, based on the overall cost-value a readout throughput result, and makes the decision by comparing the readout throughput result to a predefined target throughput. Methods for calculating the overall cost-values and readout throughput will be described in detail below.

At a reporting stage 166, the memory controller reports a refresh indication to the host based on the refresh decision made at step 162 (as described with reference to FIG. 2 above). In some embodiments, the memory controller may report to the host (instead of or in addition to the refresh indication) a refresh grade of the given group, wherein the grade is indicative of the readout throughput estimated for the group. The memory controller or host may calculate the grade, for example, as the ratio TP/TPmax, wherein TP denotes the estimated readout throughput for the group and TPmax denotes the maximal achievable readout throughput (corresponding to a low bit error rate). Following stage 166 the method terminates.

In reporting to the host, the memory controller may report an invalid grade, e.g., when one of the following events occurs: (in) The refresh indication of the group is undetermined, (ii) the scanning process has terminated before the entire scan completes, but the number of code words read in the partial scanning is less than required for a reliable estimation of the readout throughput for one or more of the scanned dies, and (iii) one or more of the read code words in the scanned group has failed decoding even when using processing elements having the highest decoding capabilities.

It should be noted that although the scanning operation in the method of FIG. 2 need not be carried out is real time, the resulting estimated readout throughput reflects real time readout throughput of the host.

In the methods of FIGS. 2 and 3 above, the accuracy of the estimated readout throughput (or overall cost-value) depends on the number of code words read during the scanning process. In some configurations, a minimal number of several (e.g., ten) thousands of code words is required for reliable estimation of readout throughput larger than 90% of TPmax. Alternatively, other suitable numbers of code words per a scan cycle can also be used.

The disclosed embodiments (e.g., the methods of FIGS. 2 and 3) provide adaptive scheduling of data refreshing, that adjusts the refresh rate depending on actual degradation in the readout throughput. The refresh rate using the disclosed methods is advantageously much lower than in conventional methods that tune the refresh rate assuming users of maximal workloads and worst-case environmental conditions. Lowering the refresh rate also reduces the number of erase-program cycles applied for the refresh. For example, in the disclosed embodiments, the number of erase-program cycles due to refresh may reduce by a factor of five compared to conventional refresh methods.

In some embodiments, the configuration of memory system 20 is asymmetric. For example, when using methods such as Redundant Array of Independent Disks (RAID), the memory system may include two channels, for example, one having 4 dies and the other 5 dies. The extra die may serve for storing redundancy data for recovering data lost in other dies. In such embodiments, the host informs the controller of the actual dies participating in the readout throughput estimation, e.g., excluding the die that stores the redundancy data.

In some embodiments memory system 20 includes multiple dies, wherein at least some of the dies includes multiple planes. In such embodiments, one or more the dies or planes becomes nonfunctional, in which case the host excludes these dies/planes from the scanning process. The host additionally indicates the missing dies/planes to the memory controller, so as to take into consideration the missing read operations in comparing the estimated readout throughput the target throughput for making the refresh decision.

Estimating Latency Cost-Value and Readout Throughput

As noted above, in some embodiments, the refresh decision is based on estimating an overall cost-value, which is indicative of the average decoding latency. A cost-value that is higher than a predefined cost threshold indicates that the readout throughput has been degraded to an unacceptable level and therefore refresh is required. In some embodiments, as will be described below, the overall cost-value may be further translated into readout throughput.

Let E1 . . . En denote a group of n processing elements that may participate in decoding a retrieved code word, and let L1 . . . Ln denote predefined respective latencies associated with the processing elements E1 . . . En. Further let Ni denote the number of code words whose decoding required the usage of processing element Ei. The overall cost-value is given by:

$$OverallCost = \sum_i Ni \cdot Li \qquad \text{Equation 1}$$

Equation 1 depicts a weighted sum that runs over the elements Ei that actually participated in decoding the scanned code words, and Li are the weights. In comparing the overall cost-value of Equation 1 to a threshold cost-value, the overall cost-value may be normalized by the total number of code words given by the sum of Ni in Equation 1.

In some embodiments, the memory controller considers extreme cases in which in terms of latency and readout throughput (i) all the dies behave similarly, and (ii) a single die behaves significantly worse than the other dies. In such embodiments, the memory controller calculates an overall cost-value for all dies and overall cost-values for individual dies as given by Equations 2 and 3:

$$CostAll = \sum_j \sum_i Nij \cdot L\_ALLi \qquad \text{Equation 2}$$

$$CostSingle\_j = \sum_i Nij \cdot L\_SINGLEi \qquad \text{Equation 3}$$

In Equation 2, Nij denotes the number of code words of the $j^{th}$ die for which the processing element Ei participated in the decoding, and L_ALLi denotes the latency of the processing element Ei for all of the dies.

In Equation 3, CostSingle_j denotes the cost value for the $j^{th}$ die, Nij denotes the number of code words of the $j^{th}$ die for which the processing element Ei participated in the decoding, and L_SINGLEi denotes the latency of Ei for a single die. The overall cost-value is given by:

$$OverallCost = \max\{CostAll, \max_j(CostSingle\_j)\} \qquad \text{Equation 4}$$

As noted above, a cost-value may be translated into readout throughput. The readout throughput may be calculated using the expression:

Equation 5:

$$TP = \frac{Nd}{Td}$$

In Equation 5, TP denotes the readout throughput, Nd denotes the amount of data transferred, and Td denotes the time required to read the amount of data from the memory device, decode the retrieved data, and transferring the decoded data to the host.

The time period Td may be divided into separate time durations as follows:

$$Td = T\min + T\text{add} \qquad \text{Equation 6}$$

In Equation 6, Tmin denotes the minimal time required to read an amount of data by the host, while decoding the read data using a lowest-complexity processing element. Further in Equation 6, Tadd denotes additional time required when engaging higher complexity processing elements in the decoding phase. Tmin may be also presented as:

Equation 7:

$$T\min = \frac{Nd}{TP\max}$$

wherein TPmax denotes the maximal achievable readout throughput. Based on the expressions above, the readout throughput for all dies is given by:

Equation 8:

$$TPall = \frac{Nd}{\frac{Nd}{TP\max} + CostAll}$$

and the readout throughput for the j'n die is given by:

Equation 9:

$$TPsingle\_j = \frac{Nd}{\frac{Nd}{TP\max} + CostSingle\_j}$$

It should be noted that in Equations 8 and 9, the maximal throughput is achieved when CostAll or ConstSingle_j is zeroed. The overall readout throughput is given by:

$$TP = \min\{TPall, \min_j(TPsingle\_j)\} \qquad \text{Equation 10}$$

The memory controller may decide that refresh is required when the ratio TP/TPmax degrades below a target percentage (e.g., below 90% of TPmax).

In some laboratory tests, the inventors compared the readout throughput estimated using Equations 8-10, to the actual readout throughput of the host. These tests indicate that the estimated readout throughput falls within +/−10% of the true readout throughput.

In some embodiments, the memory controller may calculate the costs in Equations 2-4 and the readout throughput in Equations 8-10, with Nd referring to the total amount of data read in the scanning process, and the cost values correspond to the entire number of code words read in the scanning process. In some embodiments, during the scanning process, the memory controller calculates Equations 2-4 and/or 8-10 with Nd referring to the total amount of data to be read in the scanning process, but the cost values correspond to the code words read so far (before the scanning completes). In such embodiments, the memory controller detects that readout throughput above the target throughput cannot be achieved (because the cost-values are already too high) and indicate to the host to terminate the scanning process before the entire scanning concludes.

The embodiments describe above are given by way of example, and other suitable embodiments can also be used. For example, the methods of FIGS. 2 and 3 present a certain partitioning between the host and the memory controller. In alternative embodiments, however, any other partitioning between the host and the memory controller can also be used.

In the embodiments described above, information collected on processing elements that were actually used in the decoding is used mainly for estimating the decoding latency. This collected information may be used however in other suitable ways. For example, an ordered list of the participating elements may be analyzed (e.g., using a previously trained neural network) to find possible relationships among the processing elements.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
   a memory comprising multiple memory blocks; and one or more processors, configured to:
   read at least part of data stored in a group of one or more memory blocks, the data comprising multiple code words of an Error Correction Code (ECC), wherein the ECC is decodable using one or more processing elements selected from among multiple predefined processing elements;
   decode one or more of the code words, and identify one or more or the predefined processing elements that actually participated in decoding the respective code words; and
   based on cost-values associated with the identified processing elements, wherein the cost-values are indicative of processing latencies respectively incurred by the identified processing elements, make a decision of whether or not to refresh the one or more memory blocks in the group.

2. The apparatus according to claim 1, wherein the predefined processing elements perform respective operations required for decoding of the ECC, and are associated with respective processing latencies.

3. The apparatus according to claim 1, wherein the group comprises multiple memory blocks, and wherein the one or more processors are configured to program data encoded using the ECC to the memory blocks in the group in parallel, and to read stored data from the memory blocks in the group, in parallel.

4. The apparatus according to claim 1, wherein the one or more processors are configured to calculate a weighted sum of the cost-values, and to make the decision by comparing the weighted sum to a predefined decision threshold.

5. The apparatus according to claim 1, wherein the one or more processors are configured to estimate, based on the cost-values, a readout throughput of the data from the one or more memory blocks in the group, and to make the decision by comparing the estimated readout throughput to a predefined threshold throughput.

6. The apparatus according to claim 1, wherein the one or more processors are configured to select the group, by identifying that a retention period of at least one of the memory blocks in the group exceeded a predefined retention-time threshold.

7. The apparatus according to claim 1, wherein the group comprises multiple memory blocks belonging to multiple dies, and wherein the one or more processors are configured to make the decision jointly for the multiple memory blocks in the respective dies.

8. The apparatus according to claim 7, wherein the one or more processors are configured to hold first cost-values for the multiple dies and second different cost-values for a single die, to evaluate an all-dies cost-value using the first cost-value, to evaluate multiple single-die cost-values using the second cost-values, and to make the decision based on both the all-dies cost-value and on the multiple single-die cost-values.

9. The apparatus according to claim 1, wherein the one or more processors are configured to associate first cost-values with respective processing elements in a first configuration of the apparatus, and to associate second different cost-values with same processing elements in a second different configuration of the apparatus.

10. The apparatus according to claim 1, wherein the one or more processors are configured to specify scanning multiple code words for making the decision, and to stop scanning the specified code words upon detecting, based on a partial subset of the specified code words, that a predefined target readout throughput is unachievable.

11. A method, comprising:
    in a memory comprising multiple memory blocks, reading at least part of data stored in a group of one or more memory blocks, the data comprising multiple code words of an Error Correction Code (ECC), wherein the ECC is decodable using one or more processing elements selected from among multiple predefined processing elements;
    decoding one or more of the code words, and identifying one or more of the predefined processing elements that actually participated in decoding the respective code words; and
    based on cost-values associated with the identified processing elements, wherein the cost-values are indicative of processing latencies respectively incurred by the identified processing elements, making a decision of whether or not to refresh the one or more memory blocks in the group.

12. The method according to claim 11, wherein the predefined processing elements perform respective operations required for decoding of the ECC, and associated with respective processing latencies.

13. The method according to claim 11, wherein the group comprises multiple memory blocks, and comprising programming data encoded using the ECC to the memory blocks in the group in parallel, and reading stored data from the memory blocks in the group, in parallel.

14. The method according to claim 11, wherein making the decision comprises calculating a weighted sum of the cost-values, and comparing the weighted sum to a predefined decision threshold.

15. The method according to claim 11, and comprising estimating, based on the cost-values, a readout throughput of the data from the one or more memory blocks in the group, and wherein making the decision comprises comparing the estimated readout throughput to a predefined threshold throughput.

16. The method according to claim 11, and comprising selecting the group by identifying that a retention period of at least one of the memory blocks in the group exceeded a predefined retention-time threshold.

17. The method according to claim 11, wherein the group comprises multiple memory blocks belonging to multiple dies, and wherein making the decision comprises making the decision jointly for the multiple memory blocks in the respective dies.

18. The method according to claim 17, and comprising holding first cost-values for the multiple dies and second different cost-values for a single die, evaluating an all-dies cost-value using the first cost-value, evaluating multiple single-die cost-values using the second cost-values, and making the decision based on both the all-dies cost-value and on the multiple single-die cost-values.

19. The method according to claim 11, and comprising associating first cost-values with respective processing elements in a first configuration of the apparatus, and associating second different cost-values with same processing elements in a second different configuration of the apparatus.

20. The method according to claim 11, wherein and comprising specifying scanning multiple code words for making the decision, and stopping scanning the specified code words upon detecting, based on a partial subset of the specified code words, that a predefined target readout throughput is unachievable.

\* \* \* \* \*